(12) United States Patent
Drost

(10) Patent No.: US 6,313,393 B1
(45) Date of Patent: Nov. 6, 2001

(54) HEAT TRANSFER AND ELECTRIC-POWER-GENERATING COMPONENT CONTAINING A THERMOELECTRIC DEVICE

(75) Inventor: M. Kevin Drost, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/425,832

(22) Filed: Oct. 21, 1999

(51) Int. Cl.[7] .................................................. H01L 35/34
(52) U.S. Cl. ......................... 136/201; 136/205; 136/242
(58) Field of Search .................................. 136/205, 203, 136/242; 62/3.2, 3.3, 3.4, 3.5, 3.6, 3.61, 3.7

(56) References Cited

U.S. PATENT DOCUMENTS

| | | |
|---|---|---|
| 4,732,579 | 3/1988 | Veltman et al. ............................ 55/23 |
| 4,753,682 | 6/1988 | Cantoni ................................. 136/212 |
| 4,831,664 | 5/1989 | Suda ............................................. 2/2 |
| 5,610,366 | 3/1997 | Fleurial et al. ....................... 136/202 |
| 5,611,214 | 3/1997 | Wegeng et al. ......................... 62/498 |
| 5,689,966 | 11/1997 | Zess et al. .......................... 62/238.6 |
| 5,737,923 | 4/1998 | Gilley et al. .............................. 62/3.7 |
| 5,811,062 | 9/1998 | Wegeng et al. ..................... 422/129 |
| 5,822,993 | 10/1998 | Attey ........................................ 62/3.7 |
| 5,890,372 | 4/1999 | Belding et al. ......................... 62/271 |

OTHER PUBLICATIONS

"Recent Developments in Microtechnology–Based Chemical Heat Pumps," Drost et al., Proceedings of 3rd Microreactor Conf. (Frankfurt, Germany), AICHE, DECHEMA, (Apr. 1999).

"Miniature Heat Pumps For Portable And Distributed Space Conditioning Applications," Drost et al., Proceedings of the Intersociety Energy Conversion Engineering Conference, vol. 2, pp. 1271–1274 (1997). No month given.

"Microchemical Combustor/Evaporator Thermal Processes," Drost et al., Microscale Thermophysical Engineering, vol. 1, pp. 321–332 (1997). No month given.

Primary Examiner—Bruce F. Bell
Assistant Examiner—Thomas H Parsons
(74) Attorney, Agent, or Firm—Stephen R. May

(57) ABSTRACT

A heat transfer and electric-power-generating component is disclosed that utilizes microstructural architecture for enhanced heat transfer. The component includes a heat source, a microstructural heat sink; and a thermoelectric device disposed between the heat source and the microstructural heat sink. During operation, heat flows from the heat source to the heat sink through the thermoelectric device such that the thermoelectric device can convert a portion of the heat flow into electric power. In some of the preferred aspects of the invention, the heat sink is an ultra thin film desorber combustor, and the heat source is a microchannel combustor. The microstructural architecture can provide high rates of thermal transfer through the thermoelectric device, allowing for surprisingly high thermoelectric power generation from a compact and light weight component.

16 Claims, 2 Drawing Sheets

HEAT TRANSFER AND ELECTRIC-POWER-GENERATING COMPONENT CONTAINING A THERMOELECTRIC DEVICE

BACKGROUND OF THE INVENTION

1. Field of the Invention

The present invention relates to heat transfer and electric-power-generating components containing a thermoelectric device.

2. Description of the Related Art

Compact and light-weight components capable of heat transfer and electric power generation are desirable in a variety of applications and may be especially useful in cooling systems for portable or remote applications.

Protective clothing has been an area of particular interest in the development of compact and light-weight cooling systems. Examples of people in need of protective clothing include workers exposed to hazardous materials, firefighters, police wearing body armor, and military personnel exposed to nuclear, biological or chemical (NBC) warfare agents. The use of protective clothing can reduce substantially the threat from external hazards; however, protective clothing significantly reduces heat transfer from the body, and people wearing protective clothing are susceptible to heat stress, especially in hot environments.

Extensive efforts have been directed toward developing compact and light-weight cooling systems that solve the problem of heat injury to individuals required to wear protective clothing. In "Development of a Double-loop Free Piston Microclimate Cooling System Phase I," Battelle Memorial Institute, Columbus, Ohio (1993), W. G. Atterbury describes a battery-powered vapor-compression-cycle based system sized to produce 350 $W_T$ of cooling for 4 hours weighing 10 kg with batteries representing the bulk of the system weight. In "Energy Efficient Technologies for the Dismounted Soldier," National Academy Press, Washington D. C. (1997), the National Research Council proposes an engine-driven vapor-compression-cycle manportable cooling system having a projected weight of 9 to 13 kg.

An alternative to the conventional vapor compression cycle are heat actuated heat pumps. Drost et al., in "Miniature Heat Pumps for Portable and Distributed Space Conditioning Applications," Proceedings of the Intersociety Energy Conversion Conference, vol. 2, pp 1271–74 (1997) estimate that these systems can reduce the weight of a manportable cooling system to between four and five kilograms including heat pump, air-cooled heat exchanger, batteries, and fuel.

Despite these efforts, there remains a need for a cooling unit that is portable, compact and light-weight and yet provides cooling over extended periods.

SUMMARY OF THE INVENTION

The present invention provides a heat transfer and electric-power-generating component that utilizes microstructural architecture for enhanced heat transfer. The component includes a heat source, a microstructural heat sink; and a thermoelectric device disposed between the heat source and the microstructural heat sink. During operation, heat flows from the heat source to the heat sink through the thermoelectric device such that the thermoelectric device can convert a portion of the heat flow into electric power. The microstructural architecture allows for extremely efficient mass and thermal transfer and thus can provide high rates of thermal transfer through the thermoelectric device, allowing for surprisingly high rates of thermoelectric power generation from a compact and light-weight component.

The components of the present invention provide numerous advantages over the prior art. In addition to high rates of thermal transfer, in many applications, the inventive component provides advantages such as: durability, portability, superior compatibility and performance in heat actuated heat pumps, ease of construction, few or no moving parts, low cost, low complexity, light-weight, small volumes, and reducing or eliminating the need for batteries.

The subject matter of the present invention is distinctly claimed in the concluding portion of this specification. However, both the organization and method of operation, together with further advantages and objects thereof, may best be understood by reference to the following drawings and description.

GLOSSARY

"Microstructural" means that a component has at least some structural features that have dimensions of 500 micrometers ($\mu$m) or less. The structural features are typically microchannels, having width and/or depth of from 1 to 500 $\mu$m, or troughs having thicknesses of 500 $\mu$m or less.

BRIEF DESCRIPTION OF THE DRAWINGS

FIG. 1b is an exploded view of the heat transfer and electric-power-generating component of FIG. 1a.

DESCRIPTION OF PREFERRED EMBODIMENTS

Figure 1A:
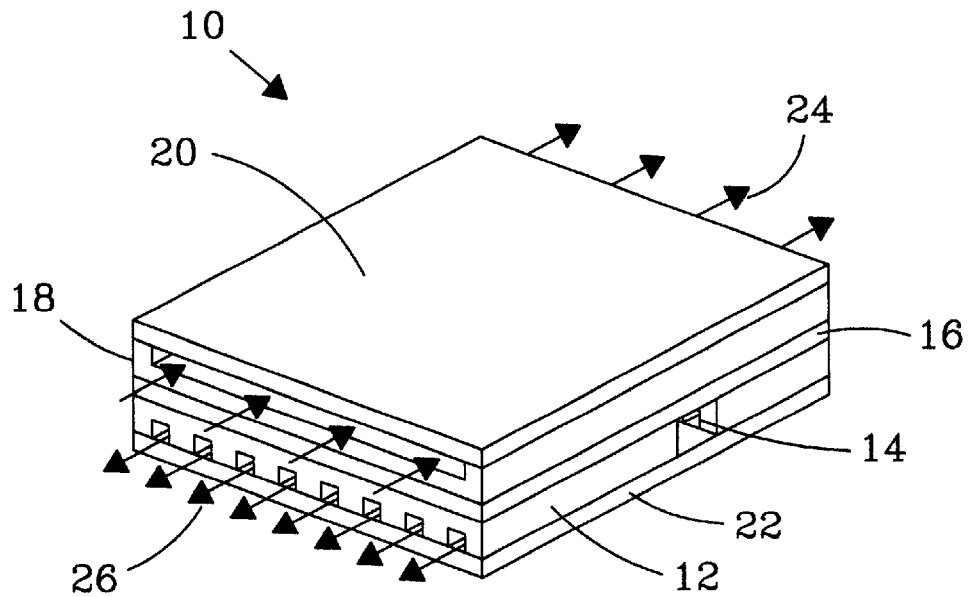
FIG. 1a is an illustration of a heat transfer and electric-power-generating component.
Figure 1B:
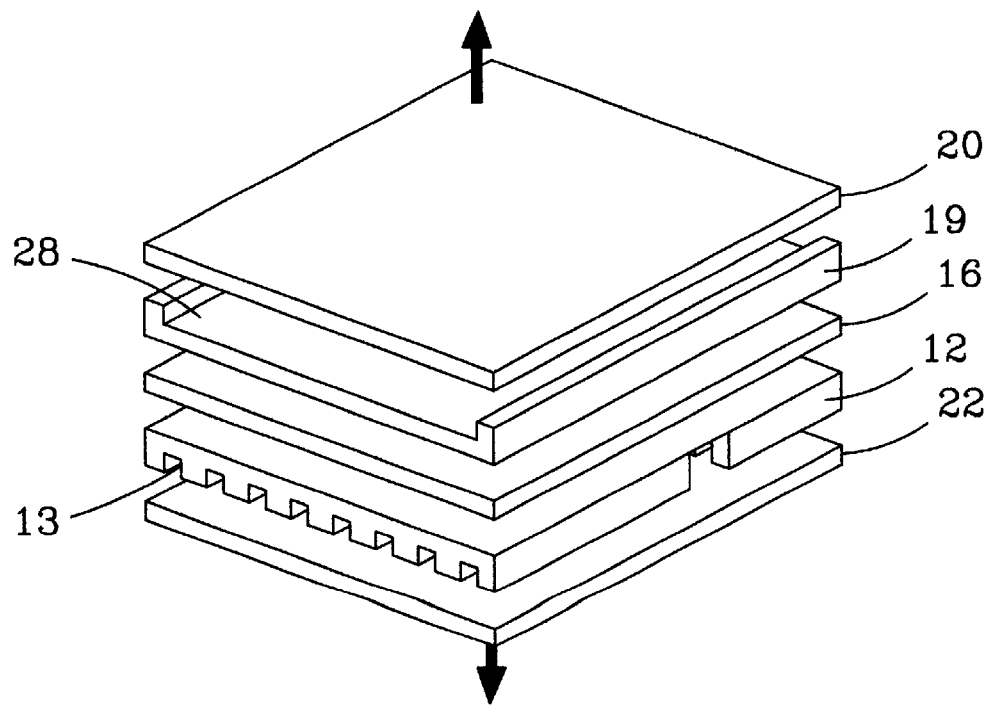

In the component 10 illustrated in FIGS. 1a and 1b, the heat source 12 is a microchannel combustor. The microchannel combustor is preferably formed of metal and has combustion channels 13 extending out from a combustion chamber 14. In a preferred embodiment, fuel and air enter the combustor and are distributed across a plate (preferably a sintered metal plate). The fuel and air may be premixed and enter the chamber through a single nozzle or may be added from separate nozzles. Combustion occurs and the combustion products 26 exit through microchannels 13, thus transferring heat by convection from the combustion products to the walls of the microchannels. The microchannels 13 preferably have widths between about 100 and 200 $\mu$m separated by 100 to 300 $\mu$m wide metal fins. The microchannels preferably have depths between about 100 $\mu$m and 1 cm, and, in one preferred embodiment, channel lengths are 2 to 6 cm. Combustion is initiated by a piezoelectric spark ignitor (not shown). Various combustor architecture and performance are discussed by Drost et al. in Microscale Thermophysical Engineering, vol. 1, pp. 321–332, 1997.

While the heat source is preferably a microchemical reactor with a microchannel combustor being especially preferred, other, nonlimiting, examples of heat sources include solar furnaces, and a layer having microchannels for conveying hot fluids (such as in a microchannel heat exchanger, see, for example, Wegeng et al. in U.S. Pat. No. 5,811,062 and U.S. patent application, Ser. No. 09/096,147, now U.S. Pat. No. 6,126,723, both of which are incorporated herein, in full)

Heat from the heat source is transferred to a thermoelectric device 16 which converts a portion of the thermal energy into an electrical current that can be conducted out of the thermoelectric device by electric leads (not shown). The thermoelectric device may be composed of materials such as bismuth telluride, lead telluride, TAGS (a material containing tellurium, silver, germanium and tin), $Zn_4Sb_3$, silicon germanium and other materials as are known in the art. Optimum operating condition for a bismuth telluride thermoelectric device are a hot side temperature of about 250° C. and a cold side temperature of about 50° C.; however, optimal operating conditions for the device as a whole may differ and in one embodiment operating conditions are a hot side temperature of about 270° C. and a cold side temperature of about 130° C. Thermoelectric devices are inefficient in converting thermal energy to electrical energy. In preferred embodiments, the thermoelectric device has an efficiency of at least 3%, and more preferably at least 5%. Thermoelectric devices suitable for use in the present invention include bismuth telluride, lead telluride, TAGS, and $Zn_4Sb_3$ units available from Hi-Z Technology, San Diego, Calif. with thicknesses ranging from about 0.1 to about 0.5 cm.

Heat flowing through the thermoelectric device passes into the heat sink. In a preferred embodiment, the heat sink is a desorber 18. A desorber body 19 (typically made of metal) is disposed between a thermoelectric device 16 and a contactor sheet 20. The desorber body 19 preferably contains microstructural elements such as a trough 28 or channels that have widths and/or depths of 300 μm or less that provide for very fast mass and thermal transfer rates. The contactor sheet 20 can be made of porous materials that allow for the passage of vapor that is generated by heating a refrigerant solution such as a $LiBr/H_2O$ or $NH_3/H_2O$ passed between the contactor sheet and desorber body 19. The contactor sheet is preferably made from porous, sintered metals. In another preferred embodiment, these sintered metals are coated with a polymer such as Teflon™ or stearic hydroxamic acid. Commercially available porous metal sheets include the Pall PMM020 and Mott 039 and 047. In an alternative embodiment, the contactor sheet can be made from a polymeric material such as polypropylene or polycarbonate. Preferably the contactor sheet and metal body are rigid to ensure an ultra-thin film for fast mass transfer. The porous contactor sheet may also be made by other known processes including micromachining, lithography, injection molding, laser cutting, and electrochemical processing. In a preferred embodiment, the channels or trough have a depth of between about 50 and 300 μm, more preferably about 100 μm. In one preferred embodiment, the channels or trough have a length of 4 to 6 cm.

As an alternative to a desorber, the heat sink can have troughs or microchannels for a coolant fluid arranged to form a heat exchanger, an endothermic microchemical reactor, chemical separation unit, etc.

The inventive component may have elements in addition to a heat sink, thermoelectric device and heat source. For example, the component can have an insulating layer 22. The component is ideal for use in a heat pump, especially a combustion-powered portable heat pump usable as a cooling unit where the lowweight cooling and electrical power generation capabilities can be put to good use. So, the component can be equipped with valves, controls, rectifiers, jet ejector for combustion air, attachment elements, housing, tubing, etc., and can be incorporated in a larger device (for example, a heat pump).

The inventive component can be used in multiple-component arrangements in series or in parallel. For example, large capacity cooling systems may require multiple desorbers operating in parallel. The microstructural architecture enables faster heat transfer than could be achieved with a large single system that utilizes macroscopic architecture.

The heat source, thermoelectric device and heat sink are typically bonded into a stack as shown in FIG. 1. The bonding can be accomplished by known methods such as clamping, bolting, adhesive bonding, holding together in a frame, etc. For efficient thermal transfer, the heat source and the heat sink should have good thermal contact with the thermoelectric device. In some embodiments there is a thin, electrically insulating layer on one or both sides of the thermoelectric device. If present, this insulating layer, such as a thin ceramic coating should provide electrical insulation without preventing heat transfer. In other embodiments, the heat source and the heat sink are in direct contact over the majority of the surface area of the thermoelectric device.

The inventive component exhibits numerous desirable properties such as thermal flux, electrical power generation, low weight, and small size. In a preferred component, the heat source and heat sink have a heat flux of at least 10 $W_T$ (thermal watts) per $cm^2$ of surface area while the thermoelectric device generates at least 0.2 $W_e$ (electric watts) per $cm^2$ of surface area, more preferably the heat source and heat sink have a heat flux of at least 20 $W_T/cm^2$ while the thermoelectric device generates at least 0.4 $W_e/cm^2$, and still more preferably the heat source and heat sink have a heat flux of at least 30 $W_T/cm^2$ while the thermoelectric device generates at least 0.5 $W_e/cm^2$. The foregoing values are to be measured according to the procedure described in the Examples section. The component preferably has a mass between 0.1 and 10 kg, more preferably between 0.1 and 0.3 kg. The component preferably has width and breadth dimensions of between about 1 and 30 cm, more preferably between about 2 and 10 cm, and a preferred thickness of between 0.2 and 10 cm, more preferably between about 0.5 and 2 cm.

Figure 2:
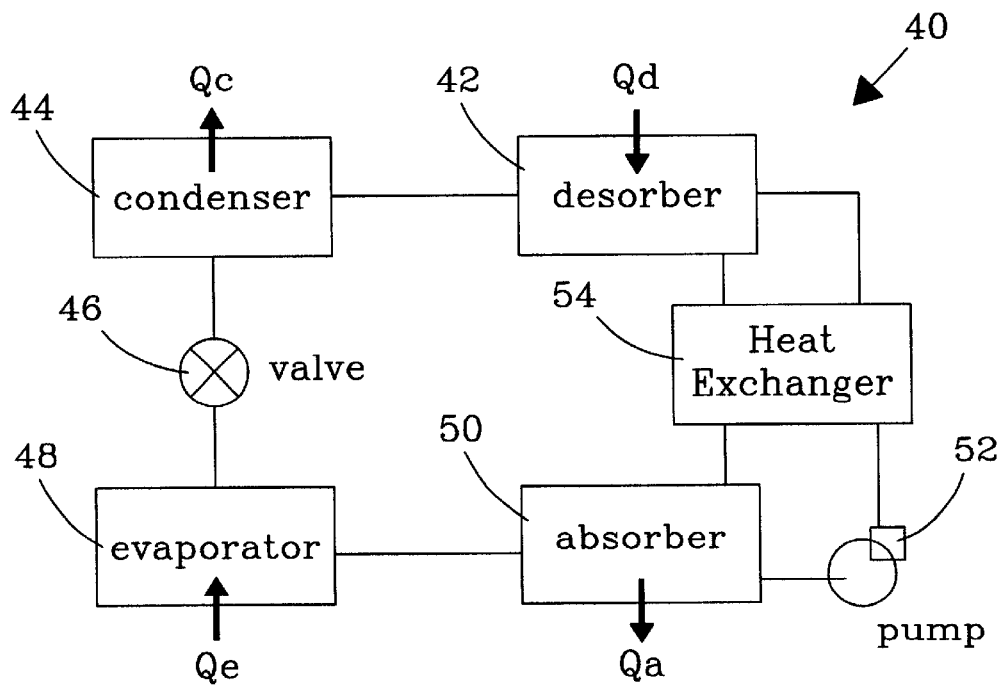
FIG. 2 is a schematic illustration of a single-effect absorption cycle cooling device.

Components of the present invention can be used in a variety of applications including, but not limited to, a cooling unit in a protective suit or portable storage unit. The inventive component can be used with particular advantage in a heat pump system. An schematic diagram of a single-effect adsorption cycle is shown in FIG. 2. Heat (Qd) is taken in and water vapor given off from a $LiBr/H_2O$ solution in the desorber. The water vapor is condensed in the condenser, producing heat (Qc) that is ejected to the environment. The water vapor then passes though an expansion valve 46 and cools in the evaporator 48. Cooling coils (not shown) could be wrapped around the evaporator to chill a coolant. Water vapor from the evaporator and the concentrated LiBr solution from the desorber are recombined in the absorber 50, and the resulting liquid solution is compressed and pumped 52 back to the desorber.

Since liquid hydrocarbons store about 100 times the energy per weight compared to batteries, it is advantageous to use combustion to power the desorber; however, electrical energy is still required for pumps and fans. The batteries for the pumps and fans can add substantial weight to the system —for example, for 8 hours of operation, batteries can be 25% of the system's weight. Providing a thermoelectric device in the system between a heat source and heat sink can provide sufficient electrical power to power the fans and pumps; thereby avoiding the need for batteries. Thus, it can be seen that the inventive component could be used to great advantage in a portable cooling unit operating by the cycle shown in FIG. 2.

EXAMPLES

Figure 3:
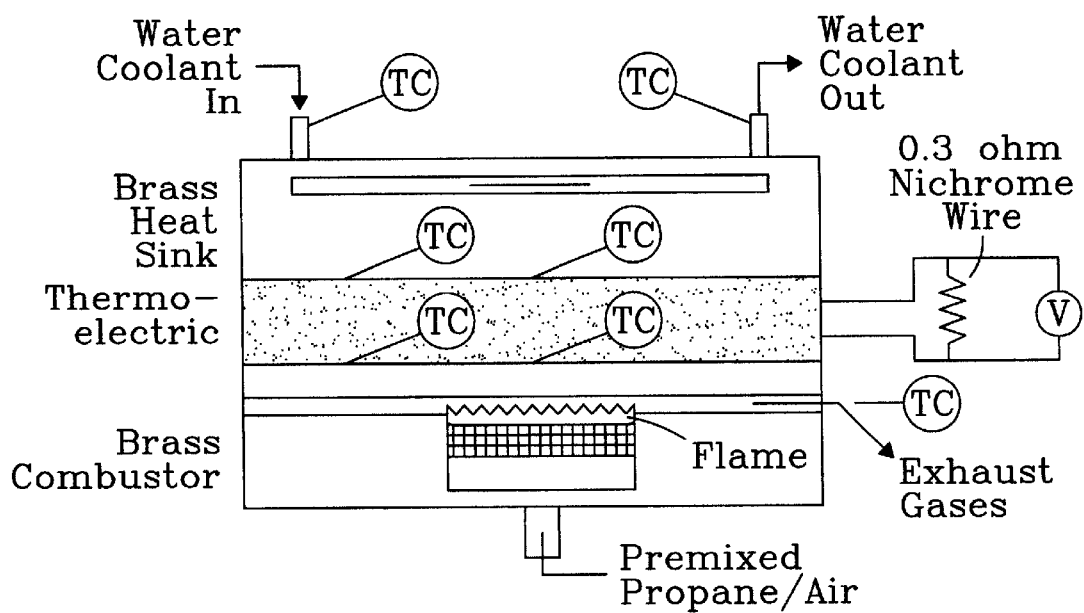
FIG. 3 is a cross-sectional diagram of an experimental arrangement that was used to test component properties.

Examples were prepared by sandwiching a bismuth telluride thermoelectric device (obtained from Hi-Z Corp.) between a propane powered microchannel combustor and a microchannel heat exchanger. A cross-sectional diagram of the apparatus is shown in FIG. 3. Ceramic wafers were placed on the upper and lower surfaces of the thermoelectric device to prevent electrical shorting of the elements comprising the thermoelectric device. Thermocouples were placed to measure temperatures on both sides of the thermoelectric device and voltage was measured across a 0.3 ohm resistor connected across the outlet leads from the thermoelectric device. Heat flux was measured from temperature change across the thermoelectric device and known conductivity, and electric power was determined from the (voltage)$^2$ divided by 0.3 ohm. The results are shown in the Table below:

| $T_{hot\ side}$ (° C.) | $T_{cold\ side}$ (° C.) | $\Delta T$ (° C.) | Thermal Powr (W) | Electric Powr (W) | Efficiency measured | Efficiency theoretical |
|---|---|---|---|---|---|---|
| 237 | 54 | 183 | 442 | 16.1 | 3.6% | 6.7% |
| 255 | 60 | 195 | 470 | 17.7 | 3.8% | 6.8% |
| 304 | 103 | 201 | 485 | 12.4 | 2.6% | 4.8% |
| 336 | 123 | 213 | 514 | 10.5 | 2.0% | 4.1% |

The surface area of each layer of the device was about 25 cm$^2$. Thus it can be seen from the Table that heat flux across the thermoelectric device varied from 17.7 $W_T$ to 20.6 $W_T$/cm$^2$ and the thermoelectric device generated between about 0.42 to about 0.71 $W_e$/cm$^2$. While a BiTe thermoelectric generator was used because it is cheap and readily available, the known thermoelectric properties of other materials such as lead telluride, TAGS, and $Zn_4Sb_3$, leads to the conclusion that electric power levels 3 to 6 times higher could be obtained by substituting these materials in place of the bismuth telluride.

CLOSURE

While some preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A heat transfer and electric-power-generating component comprising:
    a heat source;
    a microstructural heat sink; and
    a thermoelectric device disposed between the heat source and the microstructural heat sink,
    wherein, during operation, heat flows from the heat source to the heat sink through the thermoelectric device such that the thermoelectric device converts a portion of the heat flow into electric power, and
    wherein, during operation, the heat sink utilizes microstructural architecture for enhanced heat transfer.

2. The heat transfer and electric-power-generating component of claim 1 wherein the heat source comprises a microreactor.

3. The heat transfer and electric-power-generating component of claim 2 wherein the component is capable of generating an electric power of at least 0.4 $W_e$/cm$^2$ and having a thermal flux through the component of at least 20 $W_T$/cm$^2$.

4. The heat transfer and electric-power-generating component of claim 2 wherein the component has a mass of less than 0.3 kg.

5. The heat transfer and electric-power-generating component of claim 2 wherein there are no moving parts.

6. The heat transfer and electric-power-generating component of claim 2 wherein the component has a width of between 3 and 25 cm, a breadth of between 3 and 25 cm, and a thickness of between 0.3 and 5 cm.

7. The heat transfer and electric-power-generating component of claim 1 wherein the microreactor comprises a microchannel combustor.

8. The heat transfer and electric-power-generating component of claim 7 wherein the heat sink is an ultra thin film desorber comprising a desorber body and a contactor sheet.

9. The heat transfer and electric-power-generating component of claim 8 wherein the ultra thin film desorber comprising a space of 50 to 300 $\mu$m between said desorber body and said contactor sheet.

10. The heat transfer and electric-power-generating component of claim 7 wherein the component, while being fed a combustible fuel, is capable of generating at least 20 $W_e$ of electric power over 8 hours and has a volume of 400 cm$^3$ or less.

11. The heat transfer and electric-power-generating component of claim 8 further comprising an insulation layer disposed on the side of the microchannel combustor opposite the side where the thermoelectric device is disposed.

12. The heat transfer and electric-power-generating component of claim 1 wherein the heat sink is a microchannel heat exchanger.

13. A method of transferring heat and generating electric current, comprising the step of passing heat through the component of claim 1, with heat being emitted from the heat source and passing through the thermoelectric device to the heat sink.

14. The method of claim 13 wherein the heat sink is an ultra thin film desorber comprising a desorber body and a contactor sheet.

15. The method of claim 14 wherein the heat source and heat sink have a heat flux of at least 20 $W_T$/cm$^2$ while the thermoelectric device generates at least 0.4 $W_e$/cm$^2$.

16. The method of claim 13 wherein the heat sink is a microreactor having microchannels with a width of between 1 and 300 $\mu$m.

* * * * *